United States Patent [19]

Gainey

[11] Patent Number: 5,537,342
[45] Date of Patent: Jul. 16, 1996

[54] ENCAPSULATION OF ELECTRONIC COMPONENTS

[75] Inventor: Trevor C. Gainey, Aylesford, England

[73] Assignee: LSI Logic Corporation, Milpitas, Calif.

[21] Appl. No.: 331,251

[22] Filed: Oct. 28, 1994

Related U.S. Application Data

[63] Continuation of Ser. No. 856,905, filed as PCT/GB91/01460, Aug. 28, 1991, published as WO92/023847, Mar. 5, 1992, abandoned.

[30] Foreign Application Priority Data

Aug. 28, 1990 [GB] United Kingdom ............... 9018762

[51] Int. Cl.$^6$ ...................................... H05K 7/20
[52] U.S. Cl. ............... 361/705; 174/16.3; 174/35 R; 257/713; 257/659; 361/818
[58] Field of Search ................ 165/80.2, 80.3, 165/185; 174/35 R, 52.4, 16.3; 257/706, 712, 713, 708, 659; 252/500, 511; 361/704–708, 714–715, 717–718, 722, 728, 730, 816, 818

[56] References Cited

U.S. PATENT DOCUMENTS

| | | |
|---|---|---|
| 4,303,934 | 12/1981 | Stitt . |
| 4,369,330 | 1/1983 | Pilz . |
| 4,474,685 | 10/1984 | Annis ............................ 252/500 |
| 4,545,926 | 10/1985 | Fouts, Jr. et al. ............... 252/511 |
| 4,751,611 | 6/1988 | Arai . |
| 4,829,403 | 5/1989 | Harding ......................... 361/386 |
| 4,855,868 | 8/1989 | Harding . |
| 5,034,800 | 7/1991 | Marchisi . |
| 5,158,707 | 10/1992 | Vestberg et al. ................ 252/500 |

FOREIGN PATENT DOCUMENTS

| | | |
|---|---|---|
| 0009610 | 8/1979 | European Pat. Off. . |
| 0084849 | 5/1985 | Japan ............................ 357/81 |
| 0020643 | 1/1989 | Japan ............................ 357/81 |
| 0039100 | 2/1989 | Japan ............................ 174/35 R |
| 2057757 | 4/1981 | United Kingdom . |

OTHER PUBLICATIONS

Patent Abstracts of Japan, vol. 007, No. 267, (E–213) 29 Nov. 1983 & JP, A,58 148 440 (Toshiba Chemical KK.) 3 Sep. 1983.

*Primary Examiner*—Gregory D. Thompson
*Attorney, Agent, or Firm*—Townsend and Townsend and Crew

[57] ABSTRACT

For physical protection and to reduce stress, an electronic device (10) is mounted within a cavity in a housing (14) which constitutes an encapsulating member. The housing is preferably formed as two premoulded piece parts (14a, 14b). A leadframe (12) extends into the housing (14) in the manner of a sandwich construction. The device (10) may be mounted on a heat sink (16).

10 Claims, 1 Drawing Sheet

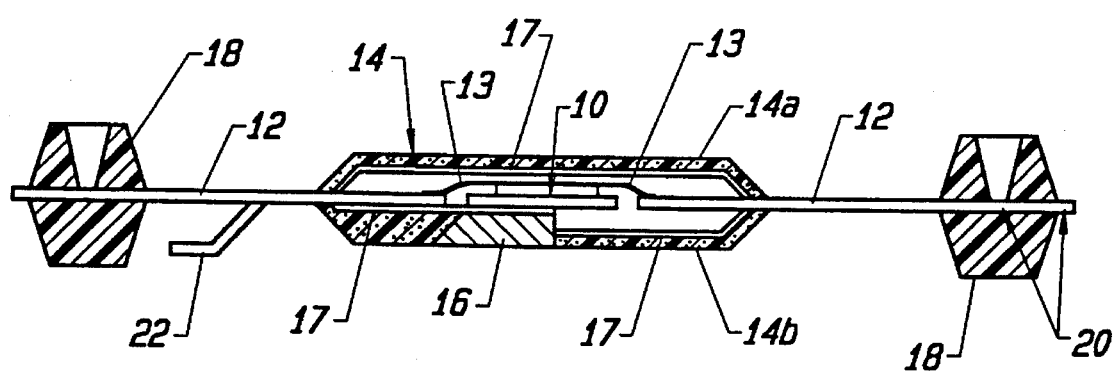

5,537,342

ENCAPSULATION OF ELECTRONIC COMPONENTS

This application is a continuation of U.S. patent application Ser. No. 07/856,905, filed as PCT/GB91/01460, Aug. 18, 1991, published as WO92/023847, Mar. 5, 1992, now abandoned.

TECHNICAL FIELD OF THE INVENTION

This invention relates to the encapsulation of electronic components, and is particularly concerned with the formation of packages for electronic components which provide physical and environmental protection to the components.

BACKGROUND OF THE INVENTION

It is an object of the present invention to provide an encapsulated device which is protected during transit from the device manufacturer to the end user, as well as during subsequent mounting operations and in-service life.

Conventionally, it is the practice to mould electronic components into a solid body of material, for example plastics material. However, this can place stress on the device or on components of the device.

SUMMARY OF THE INVENTION

In accordance with the present invention, an electronic device or electronic components are mounted within a cavity in a housing which constitutes an encapsulating member.

Preferably, the encapsulating housing is formed in two parts. A leadframe, to which the electronic device or components is/are connected, may extend through the housing in the manner of a sandwich construction.

In order that the invention may be more fully understood, two presently preferred embodiments in accordance with the invention will now be described by way of example and with reference to the accompanying drawing which is a schematic cross-sectional view through a package, showing two alternative mounting arrangements within the central housing.

BRIEF DESCRIPTION OF THE DRAWING

The sole FIGURE is a cross-sectional view of an encapsulated electronic component, according to the present invention.

DETAILED DESCRIPTION OF THE INVENTION

As shown in the drawing, an electronic device 10 which may be a semiconductor device or one or more electronic components is connected to a metal leadframe 12 by wires 13. The device 10 is mounted within a housing 14, for example of moulded plastics material, which constitutes an encapsulating member. In the illustrated embodiments the housing 14 is formed in two parts, an upper housing portion 14a and a lower housing portion 14b. In the arrangement shown in the right-hand half of the drawing, the device 10 is connected to the leadframe 12 but is out of direct contact with any part of the housing 14. In the arrangement shown in the left-hand half of the drawing, the device 10 is mounted within an upper cavity but directly onto the lower portion of the housing, which may be metalised or may incorporate an integral, thermally conductive heat sink as indicated at 16. The heat sink 16 is provided radially inwardly of the lower housing portion which here is formed as a block rather than as a shell. The upper and lower portions 14a, 14b of the housing are applied to the leadframe 12 to sandwich the leadframe therebetween, and may be joined to the leadframe by the use of adhesive. Preferably however, the housing portions 14a, 14b are fixed to the leadframe 12 by the use of high frequency vibration which causes local melting of the contact surface of the plastics housing and thus forms a bond with the leadframe.

The internal surfaces of the housing portions 14a and 14b are preferably coated with a material 17 which provides electromagnetic and radio frequency isolation of the device. The internal surface of the housing can also be connected electrically to specific leads of the device 10. This could alternatively be provided by the incorporation of a conductive matrix within the pre-moulded parts.

As shown in the drawing, a guard ring 18 is provided adjacent to the periphery of the leadframe 12 as a protective feature. This guard ring 18 is preferably formed of pre-moulded piece parts extending circumferentially around the package. Test points are indicated at 20 in the region of the guard ring, and one of the formed leads of the package is indicated at 22. The provision of a guard ring of this nature is described and claimed in our patent application GB-9018764.2.

What is claimed is:

1. A packaged electronic device comprising:

an upper housing element and a lower housing element, together the upper and lower housing elements forming a housing having a cavity;

an electronic device mounted within the cavity in the housing;

a leadframe structure having leads extending from an exterior of the housing to within the housing, the electronic device coupled to inner ends of the leads within the cavity; and a heat sink integral with one of the upper or lower housing elements, wherein the heat sink extends radially inwardly of the one of the upper or lower housing elements having the integral heat sink.

2. The packaged electronic device as recited in claim 1, wherein the heat sink is exposed to an exterior of the housing.

3. The packaged electronic device as recited in claim 1, wherein the heat sink is integral with the lower housing element.

4. The packaged electronic device as recited in claim 1, wherein the electronic device is coupled to the heat sink.

5. The packaged electronic device as recited in claim 1, wherein an internal surface of the housing is coated with a material which provides electromagnetic and radio frequency isolation of the electronic device.

6. The packaged electronic device as recited in claim 1, wherein the upper and lower housing elements are formed from a material incorporating a conductive matrix.

7. A packaged electronic device comprising:

an upper housing element and a lower housing element, together the upper and lower housing elements forming a housing having a cavity;

an electronic device mounted within the cavity in the housing;

a leadframe structure having leads extending from an exterior of the housing to within the housing, the electronic device coupled to inner ends of the leads within the cavity; and a heat sink integral with the lower housing element, the heat sink having a first surface coupled to the electronic device and a second surface exposed to an exterior of the housing, and the heat sink extending radially inwardly of the lower housing element.

8. The packaged electronic device as recited in claim 7, wherein an internal surface of the housing is coated with a material which provides electromagnetic and radio frequency isolation of the electronic device.

9. The packaged electronic device as recited in claim 7, wherein the upper and lower housing elements are formed from a material incorporating a conductive matrix.

10. A packaged electronic device comprising:

an upper housing element and a lower housing element, together the upper and lower housing elements forming a housing having a cavity;

an electronic device mounted within the cavity in the housing;

a leadframe structure having leads extending from an exterior of the housing to within the housing, the electronic device coupled to inner ends of the leads within the cavity; and a heat sink integral with the lower housing element, the heat sink having a first surface coupled to the electronic device and a second surface exposed to an exterior of the housing;

wherein the heat sink extends radially inwardly of the lower housing element and an internal surface of the housing is coated with a material which provides electromagnetic and radio frequency isolation of the electronic device.

* * * * *